United States Patent [19]

Abernathey et al.

[11] Patent Number: 5,219,788
[45] Date of Patent: Jun. 15, 1993

[54] BILAYER METALLIZATION CAP FOR PHOTOLITHOGRAPHY

[75] Inventors: John R. Abernathey, Essex; Timothy H. Daubenspeck, Colchester; Stephen E. Luce, Cambridge; Denis J. Poley; Rosemary A. Previti-Kelly, both of Richmond; Gary P. Viens, Colchester, all of Vt.; Jung H. Yoon, Pleasant Valley, N.Y.

[73] Assignee: IBM Corporation, Armonk, N.Y.

[21] Appl. No.: 661,561

[22] Filed: Feb. 25, 1991

[51] Int. Cl.[5] ............... H01L 21/443; H01L 21/465
[52] U.S. Cl. ............................ 437/187; 437/192; 437/229; 430/272; 430/318
[58] Field of Search ............... 430/318, 272; 437/942, 437/187, 194, 229, 245, 192

[56] References Cited

U.S. PATENT DOCUMENTS

| | | | |
|---|---|---|---|
| 3,884,698 | 5/1975 | Kakihama et al. | 430/272 |
| 4,288,283 | 9/1981 | Umezaki et al. | 430/318 |
| 4,321,104 | 3/1982 | Hasegawa et al. | 430/318 |
| 4,474,642 | 10/1984 | Nakane et al. | 430/318 |
| 4,491,628 | 1/1985 | Ito et al. | 430/270 |
| 4,557,797 | 12/1985 | Fuller et al. | 437/16 |
| 4,587,138 | 5/1986 | Yau et al. | 430/271 |
| 4,810,619 | 3/1989 | Pampalone et al. | 430/313 |
| 4,820,611 | 3/1989 | Arnold, III et al. | 430/318 |
| 4,910,122 | 3/1990 | Arnold et al. | 437/231 |
| 4,981,530 | 1/1991 | Clodgo et al. | 437/243 |

FOREIGN PATENT DOCUMENTS

| | | |
|---|---|---|
| 3435750 | 9/1984 | Fed. Rep. of Germany . |
| 0379924 | 1/1990 | Fed. Rep. of Germany . |
| 61-185928 | 8/1986 | Japan . |
| 0289174 | 4/1988 | United Kingdom . |

Primary Examiner—Olik Chaudhuri
Assistant Examiner—Ourmazd S. Ojan
Attorney, Agent, or Firm—Sughrue, Mion, Zinn, Macpeak & Seas

[57] ABSTRACT

A process of patterning a conductive layer on a substrate avoiding webbing yet permitting high density patterning places two layers between the resist and the metal. The first layer is an antireflective coating such as titanium nitride applied to the metal. The second layer is a barrier comprising silicon such as sputtered silicon or $SiO_2$. The barrier layer may also be a thin coating of spin-on glass. The barrier layer prevents interaction between the TiN and acid groups which are generated during exposure of the resist. With this structure in place the resist is applied, exposed and developed.

20 Claims, 2 Drawing Sheets

BILAYER METALLIZATION CAP FOR PHOTOLITHOGRAPHY

BACKGROUND OF THE INVENTION

This invention relates to semiconductor processing and, more particularly, to a process for patterning a metallization layer using a deep UV photo-resist.

In the fabrication of integrated circuit devices, one or more metallic layers, typically aluminum or titanium are deposited and subsequently patterned to provide contacts and/or electrical connections between various circuit elements. Conventionally, a photoresist is deposited over the metallic layer and then exposed to a light pattern and developed. If the metallic layer is aluminum, the metal of choice, then it is selectively plasma etched with a chlorine-containing gas through openings in the resist layer. The remaining photoresist is then removed leaving the desired metallic pattern.

Various coatings have been used over the reflective aluminum or titanium surfaces to improve resist patterning control. These coatings which are antireflective, reduce interference effects and diffuse scattering. They are particularly effective if the illumination is monochromatic. However, the effects have become less tolerable as line width and pitch have reduced with newer generations of integrated circuit configurations having greater density.

In the past, silicon has been the material of choice for use as an antireflective cap. However, silicon has a potential to diffuse into the aluminum metallization at temperatures in the order of 200° C. That temperature range is typically achieved in dry plasma photo rework processes, post-etch resist stripping, and metal annealing. Silicon diffusion results in loss of Al/Cu integrity. It thus effectively eliminates the possibility of photo rework due to the loss of the antireflective coating. Given these difficulties with the use of silicon as a cap material, titanium nitride has been employed as a substitute. It is readily sputtered in situ following the sputtering of the Al/Cu/Si layer.

Reference is made to U.S. Pat. No. 4,820,611 which describes the use of titanium nitride as an antireflective coating in a photolithographic process. In the '611 patent, the process comprises the steps of interposing a layer of TiN between a metal layer, typically aluminum, and a resist layer. This is done to reduce the amount of light reflected back from the metal surface into the resist during exposure.

Other techniques have been described in the literature to improve patterning by the use of antireflective layers. U.S. Pat. No. 3,884,698 employs an antireflective layer that it is interposed between an insulating layer, typically aluminum oxide, and a resist to promote uniform exposure of the resist. In this system uniform exposure of the resist occurs by eliminating reflected light from the interface between the insulating layer and the substrate. The antireflective layer may be a metal such as molybdenum or tantalum nitride.

U.S. Pat. No. 4,587,138 relates to a technique for forming a patterned conductive layer by employing a low temperature spin on glass containing a dye which is used as an antireflective coating between a resist and a conductive layer such as aluminum or aluminum/silicon.

In these prior art techniques, the antireflective layer is employed in contact with the resist. This in turn creates problems heretofore unsolved in the art particularly as device density increases into the submicron regime. At those density levels, it is necessary to employ deep-UV photolithographic imaging employing wavelengths in the order of 250 nm to achieve the required resolution. There are few resist systems which exist that are capable of printing reliable images of less than 0.7 micron. Such resist systems while working acceptably over oxide and silicon surfaces do not perform satisfactorily when placed in direct contact with a nitride layer. Thus, contemporary resist systems can be used in combination with nitride layers for only selective processing.

For example, many levels are compatible with such contemporary resist systems, but other levels are not. The preferred resist system is an acid-catalyzed system, that is, one where acid groups are generated during exposure of the resist to radiation of a wavelength sufficient to initiate the photochemical reaction. An example of an acid-catalyst system is found in U.S. Pat. No. 4,491,628. When using such an acid-catalyzed resist system, photolithographic patterning utilizing a TiN cap is unsatisfactory. Specifically, at those levels "webbing" or joining at the base of the resist structures is observed. Such a defect does not dissolve with satisfactory structure definition even when excess developing is employed. It is believed that this defect is a consequence of chemical interaction between the TiN surface and the base of the photoresist layer. The result of this interaction renders the bottom portion of the resist immune to either deep UV photoimaging or image developing operations. Thus, this failure to develop the resist causes defects, such as "webbing" between the photoresist features.

SUMMARY OF THE INVENTION

Given these deficiencies in the prior art, it is an object of this invention to prevent the interaction between the resist and an antireflective cap film to permit reliable submicron photo-imaging.

Yet another object of this invention is to provide a satisfactory barrier that avoids undesirable interactions while at the same time providing a technique that achieves photolithographic low reflectivity.

Still another object of this invention is to provide an improved cap structure that allows photo-rework processing without sacrificing the cap layer.

Yet another object of this invention is to provide a cap material that is easily applied yet can be removed utilizing conventional techniques.

These and other objects of this invention are achieved in a first embodiment by interposing at least two layers, an antireflective layer and a barrier layer between the resist and the metal. In a first step, an anti reflective coating, preferably titanium nitride is applied to the metal. The titanium nitride also provides proper adhesion for the second, barrier layer. This barrier layer comprises a silicon containing material such as sputtered silicon or $SiO_2$ which is applied directly to the antireflective layer. The barrier layer is required to prevent interaction between the TiN and the acid groups which are generated during exposure of the resist. Without the barrier layer, the basic character of the nitride results in chemical interaction with the acid groups such that the resist film will remain in undesired areas following development. The required vertical profiles, for example, side wall of metal lines are thus not achieved. Additionally, the TiN serves to prevent silicon transport from the barrier layer to the aluminum containing metal layer. In accordance with this first embodiment, the resist is then exposed and developed to form the desired image having the required vertical profiles which is then transferred to the metallization layer.

In a second preferred embodiment of this invention the barrier layer is a thin coating of spin-on glass. The spin-on glass serves as a thin oxide layer to prevent interaction between the TiN and the resist.

These and other objects of this invention will be described in greater detail by referring to the attached drawing and the description of the preferred embodiments that follow.

BRIEF DESCRIPTION OF THE DRAWINGS

It will be understood by those working in this technology that the drawings herein are not drawn to scale and are intended to illustrate only one portion of the process of forming an integrated circuit in accordance with this invention.

DESCRIPTION OF THE PREFERRED EMBODIMENTS

Figure 1A:
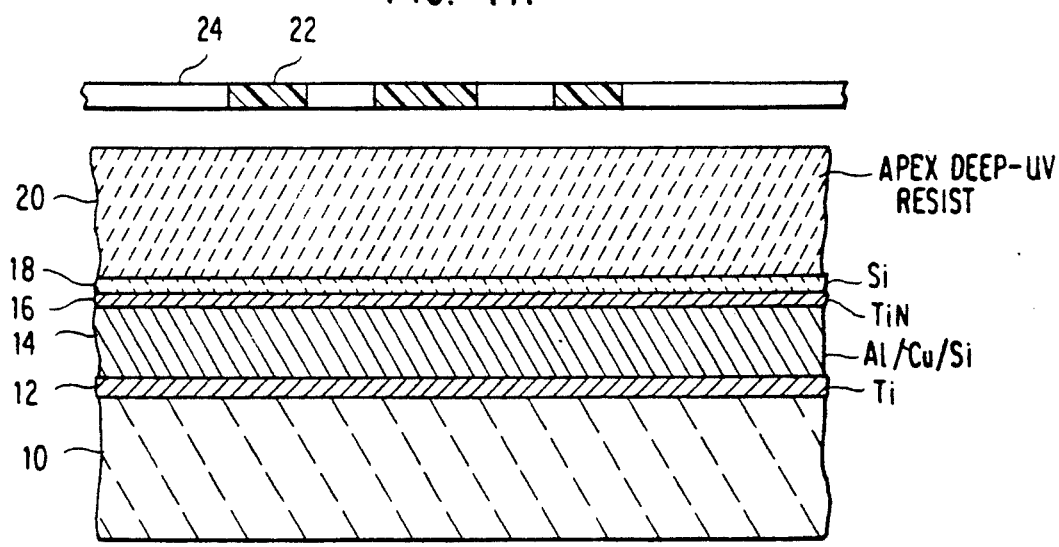
FIG. 1A illustrates a cross sectional view of a portion of an integrated circuit structure illustrating a first step in the process of this invention.
Figure 1B:
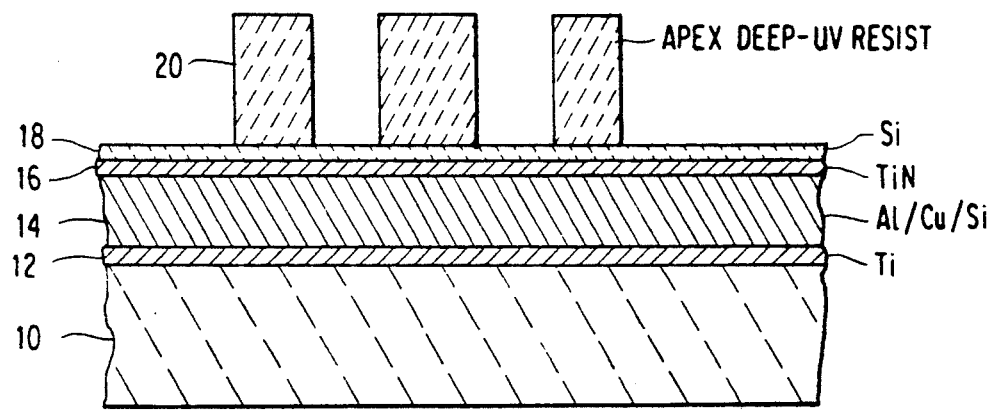
FIG. 1B is a cross sectional view of a portion of integrated circuit structure illustrating a second step in the process of this invention.
Figure 1C:
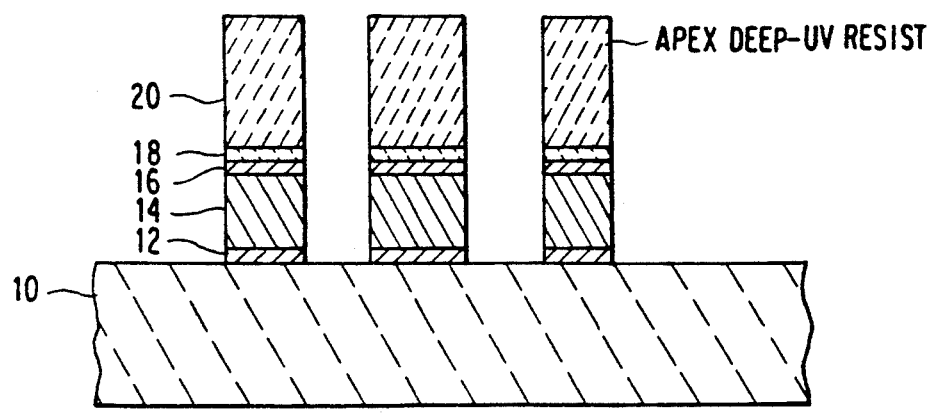
FIG. 1C is a cross section of a portion of integrated circuit structure in FIG. 1B illustrating a subsequent step in the process of the present invention.

Referring now to FIGS. 1A, 1B and 1C, the essential steps in the practice of this invention will be described. In FIG. 1A, on a silicon or glass substrate 10 a highly reflective metallic layer is formed. As illustrated, the highly reflective metallic layer comprises, in this preferred embodiment, a titanium layer 12 and a layer of Al/Cu/Si 14 deposited thereon. It will be appreciated by those working in this technology that the invention is not restricted to such a Al/Cu/Si/Ti structure but rather, can be practiced with any metallic highly reflective layer. Deposition of the metallic layer is by known technology.

In accordance with this invention next, a bilayer metallization cap is placed over the highly reflective metal layer 14. A layer 16 of approximately 150 A of TiN is sputtered deposited over layer 14. In turn, a layer of approximately 250 A of Si is then sputtered over layer 16 without breaking the vacuum. The Si layer is illustrated by numeral 18 in FIG. 1A.

A deep UV resist layer 20 is then applied on the Si layer 18. This resist may be that described in U.S. Pat. No. 4,491,628, the disclosure of which is expressly incorporated by reference. The resist layer 20 is an acid-catalyzed system. That is, it is one where acid groups are generated during exposure of the resist to deep UV.

As illustrated in FIG. 1A, the bilayer metallization cap acts as a mutual barrier to prevent potentially undesirable interactions while at the same time satisfying the photolithographic requirement for reduced reflectivity. Specifically, the TiN layer 16 serves to prevent Si from diffusing into the Al/Cu during high temperature processing. The Si layer 18 prevents the TiN from interacting adversely with the deep UV photoresist layer 20.

A suitable mask 22 has openings 24 associated therewith defining the pattern. The apertures 24 allow light or optical radiation to pass through and expose only those portions of the resist layer 20 underlying the apertures. This results in patterning of the resist as illustrated in FIG. 1B. Following exposure of the resist 20, the layer is developed using solvents to remove those exposed portions. Processing of the resist is described in U.S. Pat. No. 4,491,628. The resulting stack is illustrated in FIG. 1B.

Next, processing of the antireflective bilayer is accomplished utilizing conventional etching techniques. That is, portions of the Si or SiO$_2$ layer 18 and the TiN layer are etched by utilizing plasma etching or the like as is well established in this technology. This in turn uncovers portions of the underlying metal layer 14 for subsequent processing as illustrated in FIG. 1C.

Figure 2A:
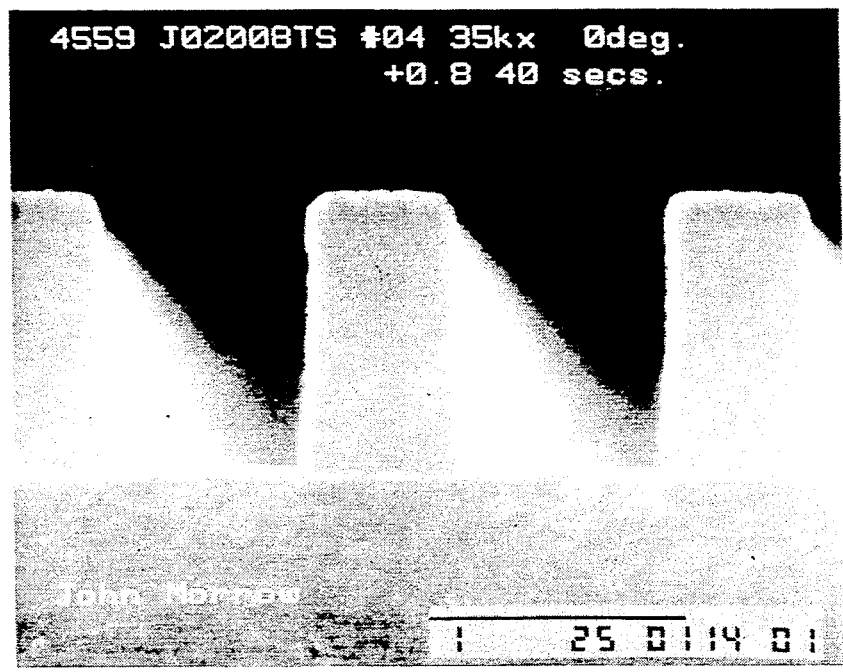
FIGS. 2A and 2B are microphotographs illustrating a structure made in accordance with this invention.
Figure 2B:

FIGS. 2A and 2B are microphotographs illustrating the intermediate product obtained utilizing the bilayer metallization cap which has the TiN cap layer separated from the resist layer 20 by means of the Si layer 18. As illustrated, there is no webbing at the base of the trenches. Rather, the system exhibits nearly straight wall profiles to the base of the side wall.

In a second preferred embodiment of this invention, the silicon layer 18 is replaced with a thin layer of spin on glass on top of the TiN layer 16 The spin on glass may be a material such as selected alkoxysilanes, "SQ$_2$" a commercial product manufactured by Allied Signal Corp. which is a methyl phenyl silsesquioxane, an amino silsesquioxane disclosed in U.S. Pat. No. 4,981,530 and variations thereof. Such materials are spin applied to the TiN layer and then baked. The bake temperature is approximately 10° higher than that of the temperatures used to apply the resist layer 20. This prevents outgasing. The spun on glass layer thus acts as a thin SiO$_2$ layer that prevents interaction between the antireflective layer of TiN and the resist 20. The same results are achieved in this system. That is, complete developing of the resist occurs thus avoiding the webbing which is a characteristic of prior art techniques.

It will be appreciated by those having working skill in this technology that other modifications of this invention may be practiced without departing from the essential scope thereof.

We claim:

1. A method for forming a patterned conductive layer comprising the steps of:
   forming a conductive layer on a surface of a substrate;
   applying a metal nitride antireflective layer over said conductive layer;
   forming a barrier layer having a silicon-containing component to said antireflective layer;
   applying a resist layer to said barrier layer, said resist containing a photoinitiator which generates acid groups upon exposure to radiation, said barrier layer inhibiting interaction between said antireflective layer and said acid groups generated during exposure of said resist;
   exposing and developing said resist to uncover portions of said barrier layer in an image; and
   removing said uncovered portions of said barrier layer and corresponding underlying portions of both said antireflective layer and said conductive layer to form a patterned conductive layer.

2. The method of claim 1 wherein said antireflective layer comprises TiN and said barrier layer is Si.

3. The method of claim 1 wherein said antireflective layer comprises TiN and said barrier layer is spin on glass.

4. The method of claim 3 wherein said spin on glass is selected from the group consisting of alkoxysilanes, methyl phenyl silsesquioxane and amino silsesquioxane.

5. The method of claim 1 wherein said conductive layer comprises a layer of Ti on said substrate and a layer of Al/Cu/Si applied to said Ti layer.

6. The method of claim 1 wherein said barrier layer comprises silicon dioxide.

7. The method of claim 1 wherein said barrier layer comprises sputtered silicon.

8. The method of claim 1 wherein said step of exposing comprises the step of exposing said resist to light of a wavelength sufficient to initiate the photochemical reaction.

9. The method of claim 1 wherein said conductive layer comprises the steps of sputter coating said substrate with a layer of Ti and sputter coating said Ti layer with a layer of Al/Cu/Si.

10. The method of claim 1 wherein said antireflective layer comprises TiN and said barrier layer is $SiO_2$.

11. A method for patterning a conductive layer comprising the steps of:
   forming a conductive layer to be patterned on a surface of a substrate;
   applying a metal nitride antireflective layer over the surface of said conductive layer;
   forming a barrier layer which includes a silicon-containing component to the surface of said antireflective layer;
   applying a resist layer to said barrier layer, said resist containing a photoinitiator which generates acid groups upon exposure to radiation, said barrier layer inhibiting interaction between said antireflective layer and said acid groups generated during exposure of said resist;
   exposing and developing said resist to uncover portions of said barrier layer in a patterned image;
   removing said uncovered portions of said barrier layer; and
   removing corresponding underlying portions of both said antireflective layer and said conductive layer to form a patterned conductive layer.

12. The method of claim 11 wherein said antireflective layer comprises TiN and said barrier layer is Si.

13. The method of claim 11 wherein said antireflective layer comprises TiN and said barrier layer is spin on glass.

14. The method of claim 13 wherein said spin on glass is selected from the group consisting of alkoxysilanes, methyl phenyl silsesquioxane and amino silsesquioxane.

15. The method of claim 11 wherein said conductive layer comprises a layer of Ti on said substrate and a layer of Al/Cu/Si applied to said Ti layer.

16. The method of claim 11 wherein said barrier layer comprises silicon dioxide.

17. The method of claim 11 wherein said barrier layer comprises sputtered silicon.

18. The method of claim 11 wherein said step of exposing comprises the step of exposing said resist to light of a wavelength sufficient to initiate the photochemical reaction.

19. The method of claim 11 wherein said conductive layer comprises the steps of sputter coating said substrate with a layer of Ti and sputter coating said Ti layer with a layer of Al/Cu/Si.

20. The method of claim 11 wherein said antireflective layer comprises TiN and said barrier layer is $SiO_2$.

* * * * *